United States Patent
Laub et al.

(10) Patent No.: US 7,609,058 B2
(45) Date of Patent: Oct. 27, 2009

(54) METHOD AND APPARATUS FOR GENERATING A MAGNETIC RESONANCE DATA FILE

(75) Inventors: Gerhard Laub, Los Angeles, CA (US); Randall Kroeker, Winnipeg (CA)

(73) Assignee: Siemens Medical Solutions USA, Inc., Malvern, PA (US)

( * ) Notice: Subject to any disclaimer, the term of this patent is extended or adjusted under 35 U.S.C. 154(b) by 3 days.

(21) Appl. No.: 11/936,857

(22) Filed: Nov. 8, 2007

(65) Prior Publication Data

US 2008/0116892 A1 May 22, 2008

Related U.S. Application Data

(60) Provisional application No. 60/859,694, filed on Nov. 17, 2006.

(51) Int. Cl.
*G01V 3/00* (2006.01)
(52) U.S. Cl. .................................................. 324/307
(58) Field of Classification Search ......... 324/300–322; 600/410–435
See application file for complete search history.

(56) References Cited

U.S. PATENT DOCUMENTS

| 5,713,358 | A | 2/1998 | Mistretta et al. |
| 5,754,046 | A | 5/1998 | Busch et al. |
| 5,873,825 | A | 2/1999 | Mistretta et al. |
| 6,380,740 | B1 | 4/2002 | Laub |
| 6,411,089 | B1 * | 6/2002 | Anand et al. ................ 324/309 |
| 6,487,435 | B2 | 11/2002 | Mistretta et al. |
| 7,003,343 | B2 | 2/2006 | Watts et al. |
| 7,005,853 | B2 * | 2/2006 | Tsao et al. ................... 324/309 |
| 7,403,005 | B2 * | 7/2008 | Katscher et al. ............. 324/309 |
| 7,439,737 | B2 * | 10/2008 | Weiss et al. ................. 324/307 |
| 7,439,739 | B2 * | 10/2008 | Beatty ......................... 324/309 |

OTHER PUBLICATIONS

Todd Parrish et al. "Continuous Update with Random Encoding (CURE); A New Strategy for Dynamic Imaging", MRM 33-326-336 (1995) From the Department of Radiology and Center for Magnetic Resonance Research, University of Minnesota Medical School, Minneapolis.

(Continued)

*Primary Examiner*—Brij B. Shrivastav
*Assistant Examiner*—Dixomara Vargas
(74) *Attorney, Agent, or Firm*—Schiff Hardin LLP

(57) ABSTRACT

In a method for operating a magnetic resonance imaging system to generate a magnetic resonance data file, raw magnetic resonance data are acquired, and k-space is established in a computerized storage medium, with k-space being divided into a contiguous central region and a contiguous region surrounding the central region. In a computerized procedure, the raw data are entered into k-space at a constant sampling rate for both of the central and peripheral regions, while sampling the central region with a first density of sampling points, and sampling the peripheral region at a second density of sampling points that is less than the first sampling density. The set of data points thereby representing sampled k-space is made available in a data file as an output from the computerized procedure, in a form allowing an image to be reconstructed from the contents of the data file.

17 Claims, 7 Drawing Sheets

$N_A$= number of sampling points in A $N_B$= number of sampling points in B $N_A = f \times (N_A + N_B)$ with f < 100 [%]

OTHER PUBLICATIONS

C.M. Pinto et al, "Time-Resolved Magnetic Resonance Fistulography with TREAT and GRAPPA for Surveillance of Hemodialysis Arteriovenous Fistulae" Proc. Intl. Soc. Mag. Reson. Med. 13 (2005), p. 452.

J.C. Carr et al. "ECG-Triggered Dynamic Time-Resolved Magnetic Resonance Angiography of the Thoracic Aorta", Proc. Intl. Soc. Mag. Reso. Med. 13 (2005), p. 381.

T.A. Cashen et al. "Comparison of Temporal and Spatial Undersampling Techniques for Time-Resolved Contrast-Enhanced MR Angiography", Proc. Intl. S oc. Mag. Reson. Med. 13 (2005), p. 380.

Todd Parrish et al. "Continuous Update with Random Encoding (CURE): A New Strategy for Dynamic Imaging", p. 482, Department of Radiology and Center for MR Research, University of Minnesota, Minneapolis MN.

Todd Parrish et al. "Random Phase Encoding for Continuous Image Updating", p. 38 Department of Radiology University of Minnesota Medical School, Minneapolis, MN.

* cited by examiner

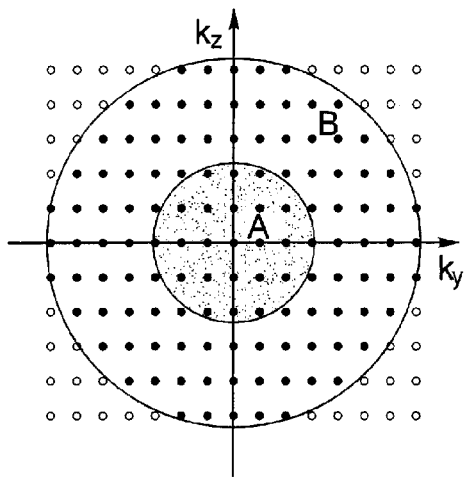
$N_A$ = number of sampling points in A
$N_B$ = number of sampling points in B
$N_A = f \times (N_A + N_B)$
with $f < 100$ [%]
FIG. 2
FIG. 3
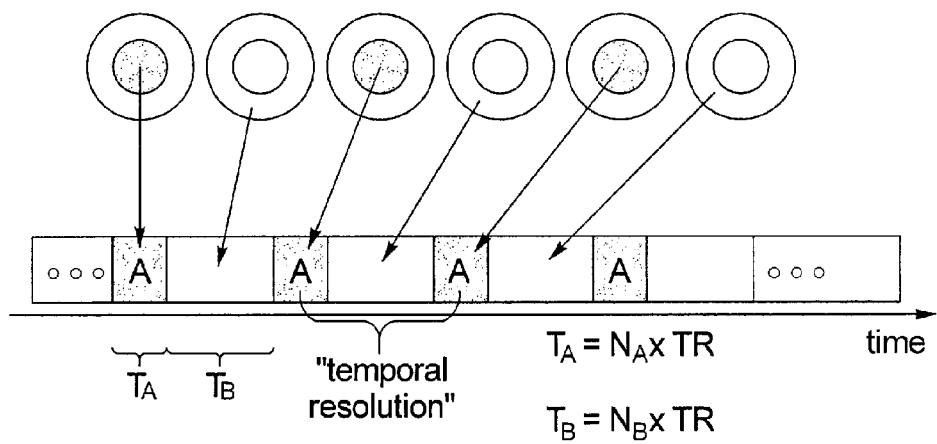
$T_A = N_A \times TR$
$T_B = N_B \times TR$ Note: Trajectories in B are complimentary to scan all k-space points in multiple measurements.

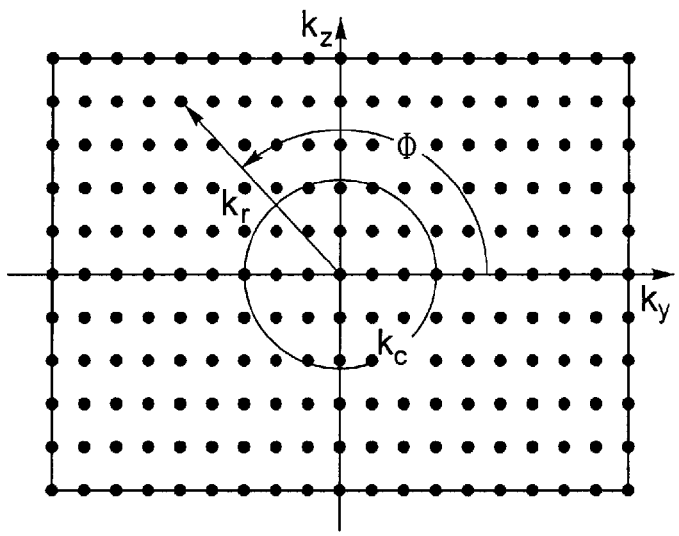
$k_y$ and $k_z$ denote the phase encoding directions along y, and z, respectively. The readout coordinate $k_x$ is omitted for simplicity.
FIG. 6
FIG. 7
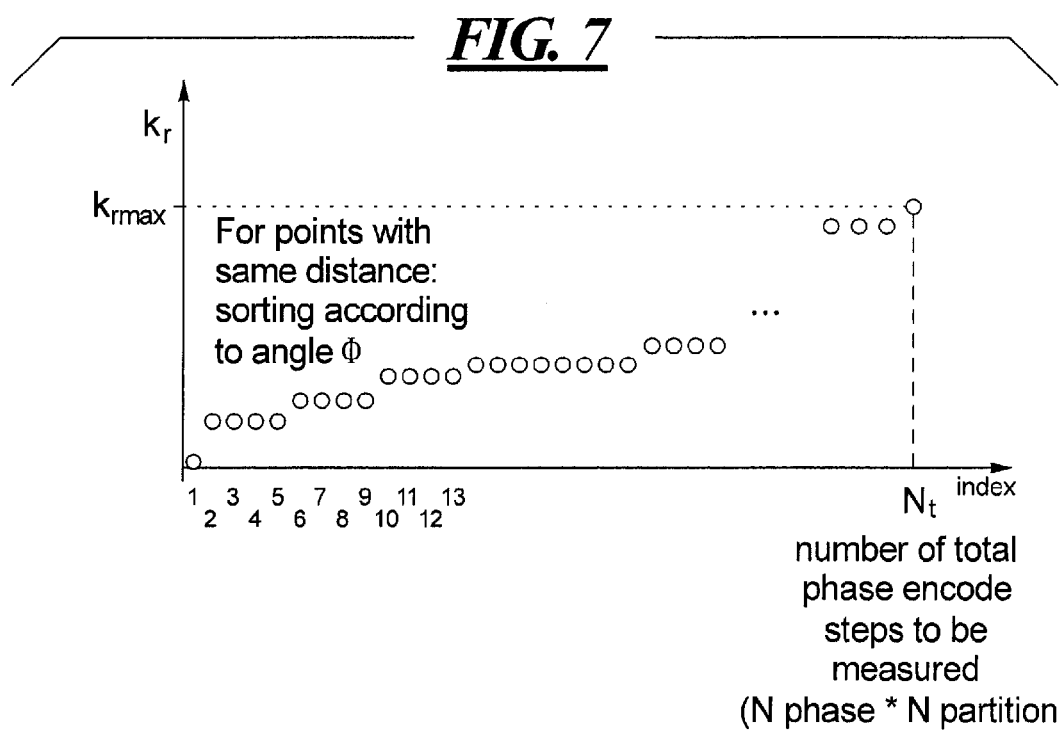

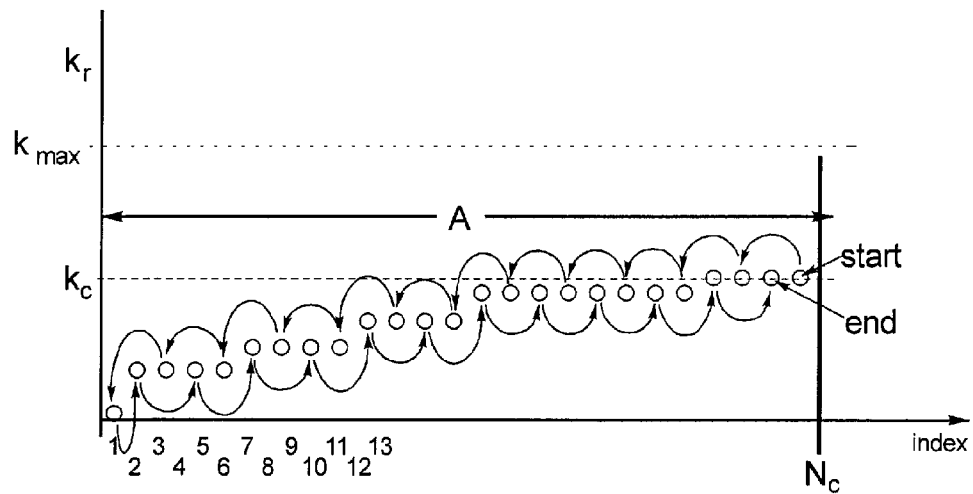
FIG. 10
FIG. 11
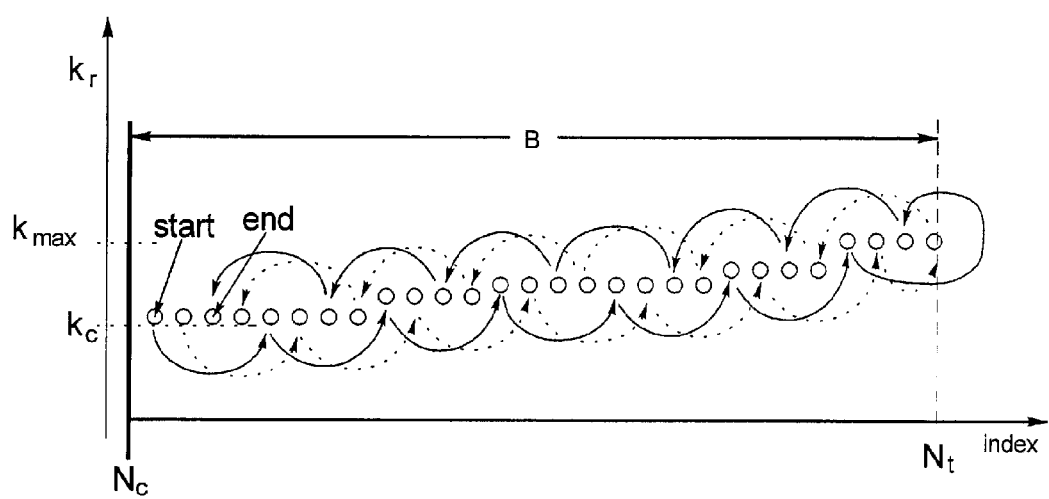

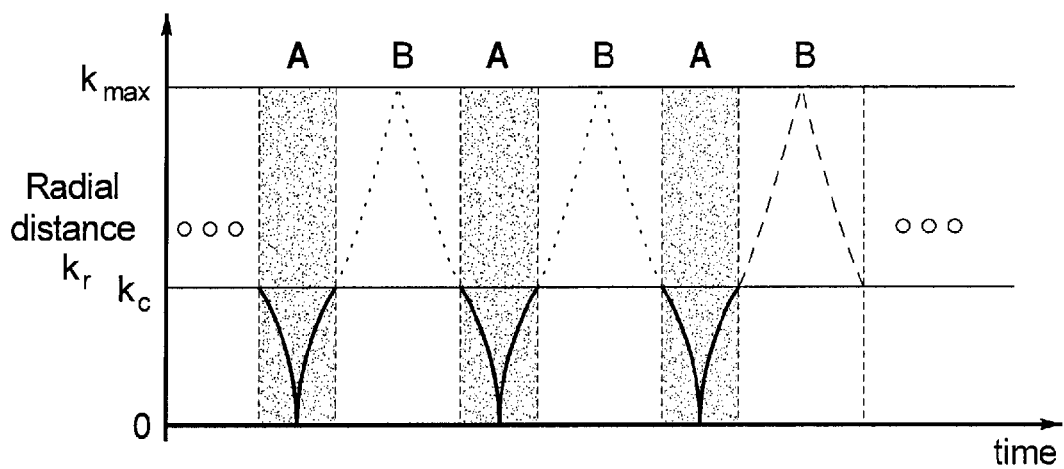
These trajectories have lower sampling density. Effectively, they are all different due to a varying azimuthal starting angle at $k_c$
*FIG. 12*
*FIG. 13*
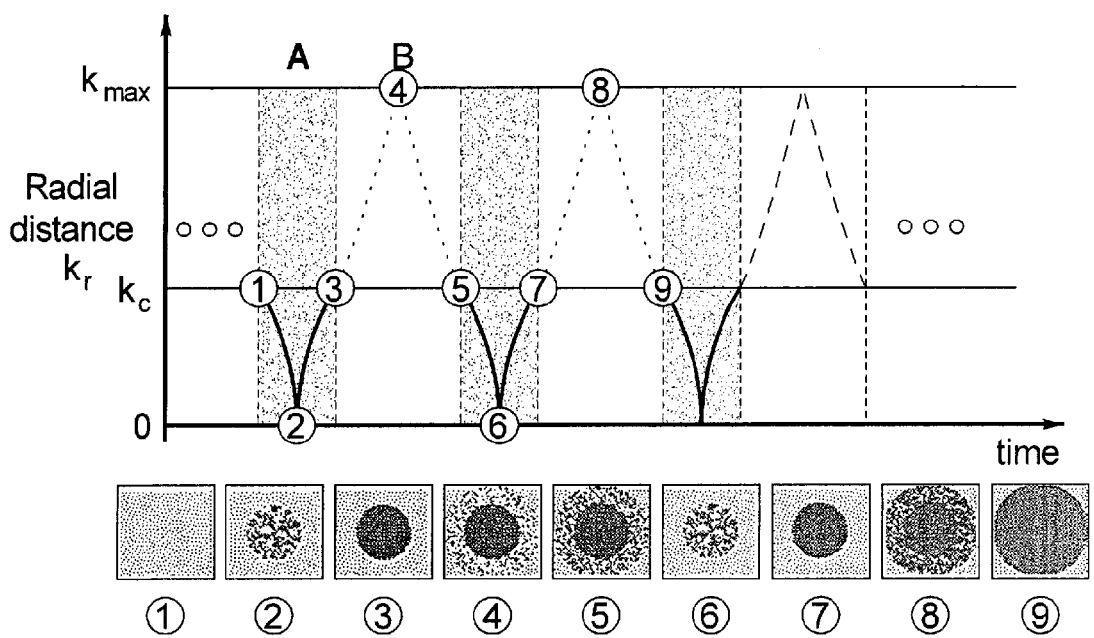

METHOD AND APPARATUS FOR GENERATING A MAGNETIC RESONANCE DATA FILE

RELATED APPLICATION

The present application claims the benefit of the filing date of provisional application 60/859,694, filed on Nov. 17, 2006.

BACKGROUND OF THE INVENTION

1. Field of the Invention

The present invention relates to methods and systems for generating a magnetic resonance data file from raw magnetic resonance data acquired from an examination subject.

2. Description of the Prior Art

Magnetic resonance imaging is a widely used image modality, wherein an examination subject is moved into a strong, static basic magnetic field to cause nuclear spins in the examination subject, that were previously randomly oriented, to become aligned with the direction of the basic magnetic field. Radio-frequency (RF) energy is then radiated into the examination subject, causing the nuclear spins to be deflected from their aligned orientation. As the nuclear spins precess upon returning to the aligned orientation, they emit RF magnetic resonance signals that are detected and from which an image of an interior region of the examination subject can be constructed according to any number of known image reconstruction techniques.

For the purpose of spatially encoding the magnetic resonance signals, the examination subject is also in the presence of gradient fields, respectively generated by gradient coils, the gradients field typically being oriented along the respective axes of a Cartesian coordinate system, with the z-axis of this coordinate system corresponding to the longitudinal axis of the examination subject.

The received magnetic resonance signals are referred to as raw data, and the raw data are stored in a computer memory that represents a mathematical domain, also referred to as the spatial domain, known as k-space. The raw data are entered in k-space at respective points that are (usually) equidistantly spaced from each other, so as to form a grid-like format. For reconstructing an image from the raw data, the raw data are subjected to a Fourier transformation to transform the raw data into image data in the image domain, from which the image of the examination subject is reconstructed.

A certain amount of time is necessary in order to acquire a sufficient amount of magnetic resonance data in order to generate an image that is substantially free of artifacts and noise, and that has a sufficient contrast so that the diagnostic content of the image can be easily discerned. When obtaining a magnetic resonance image of an organ in the form of a static "snapshot," although it is usually desirable to shorten the acquisition time for patient comfort and for the purpose of making use of the imaging apparatus in an efficient manner, a somewhat longer data acquisition time can be tolerated, if necessary in order to produce the aforementioned desirable characteristics of the resulting image.

A different situation exists, however, in so-called dynamic studies, wherein a physiological process that changes with respect to time is being imaged by magnetic resonance techniques. An example is magnetic resonance angiography (MRA), wherein typically a contrast agent is injected into the vascular system of a patient, and data acquisition of the region of interest must be timed to occur within a time window within which the contrast agent bolus is flowing through the region of interest. It is also desirable under many circumstances to obtain a relatively rapid series of magnetic resonance exposures as the contrast agent proceeds through the region of interest. Therefore, particularly in this context, it is desirable to be able to increase the time resolution of the generated images, i.e., to reduce the amount of time between the respective beginnings of data acquisition for each image.

Various techniques for improving the time resolution in magnetic resonance imaging are known that are based on the fact that the central region of k-space contains the most relevant data, or at least the data that are primarily the basis for obtaining an image with a good contrast. Various techniques are therefore known in the field of magnetic resonance imaging wherein the data in this central region of k-space are more frequently updated than the data in the peripheral regions of k-space. This type of k-space sampling is known as the keyhole technique, and is described, for example, in U.S. Pat. No. 5,754,046 and in "Composite k-Space Windows (Keyhole Techniques) To Improve Temporal Resolution in a Dynamic Series of Images Following Contrast Administration," Brummer et al, SMRM, August 1992, Page 4236.

It is also known to increase the frame rate of a series of reconstructed magnetic resonance images in a dynamic MRA study by sampling the central region of k-space at a higher rate than the peripheral regions of k-space, as described in U.S. Pat. No. 5,713,358. In this technique, image frames are reconstructed at each sampling of the central k-space region, using the temporally nearest samples from the peripheral k-space regions.

SUMMARY OF THE INVENTION

It is an object of the present invention to provide a further technique for improving time resolution in the acquisition of a series of magnetic resonance images.

A further object of the present invention is to provide a magnetic resonance imaging apparatus, and a method for operating such a magnetic resonance imaging apparatus, wherein an improved time resolution is achieved in the acquisition of a series of magnetic resonance images.

A further object of the present invention is to provide a method for generating a magnetic resonance data file, that contains magnetic resonance image data in a form suitable for reconstructing a magnetic resonance image therefrom.

The above objects are achieved in accordance with the present invention by a magnetic resonance imaging apparatus, a method for operating such an apparatus, and a method for generating a magnetic resonance data file, wherein raw magnetic resonance data are acquired using a magnetic resonance imaging sequence, k-space is established in a computerized storage medium and k-space is divided in this storage medium into a central region and a peripheral region surrounding the central region, and wherein the raw data are entered into k-space at a constant sampling rate for both of the central and peripheral regions, while sampling the central region with a first density of sampling points and sampling the peripheral region at a second density of sampling points that is less than said first density, and wherein k-space sampled in this manner is made available in a data file as an output.

The k-space data in the data file can be transformed in a known manner, by Fourier transformation, into an image file. An image of an examination subject can then be reconstructed in a known manner from the image file.

The scanning of k-space can take place according to a non-linear k-space scanning trajectory, such as a spiral scanning trajectory.

In an embodiment, the central region of k-space can be a contiguous circular region, and the outer region can be a donut-shape contiguous region. A radius can be established that defines the circular boundary between the central region and the peripheral region.

The magnetic resonance data can be acquired from the examination subject after the injection of a contrast agent into the examination subject, such as for the purpose of magnetic resonance angiography (MRA).

The raw data can be acquired by a partial parallel acquisition (PPA) technique, such as according to the known GRAPPA magnetic resonance imaging sequence.

BRIEF DESCRIPTION OF THE DRAWINGS

FIG. 2 schematically illustrates an example of the division of k-space into two regions, in accordance with the present invention.

FIGS. 3 and 4 illustrate the basic principal of sampling the two regions of k-space in accordance with the present invention.

FIG. 6 schematically illustrates a starting point for defining the scanning trajectory for scanning k-space in accordance with the present invention.

FIGS. 7, 8, 9, 10 and 11 are a sequence for illustrating and explaining the scanning trajectory in accordance with the present invention.

FIGS. 12 and 13 schematically illustrate how the individual trajectories are combined in a series in accordance with the present invention.

DESCRIPTION OF THE PREFERRED EMBODIMENTS

Figure 1:
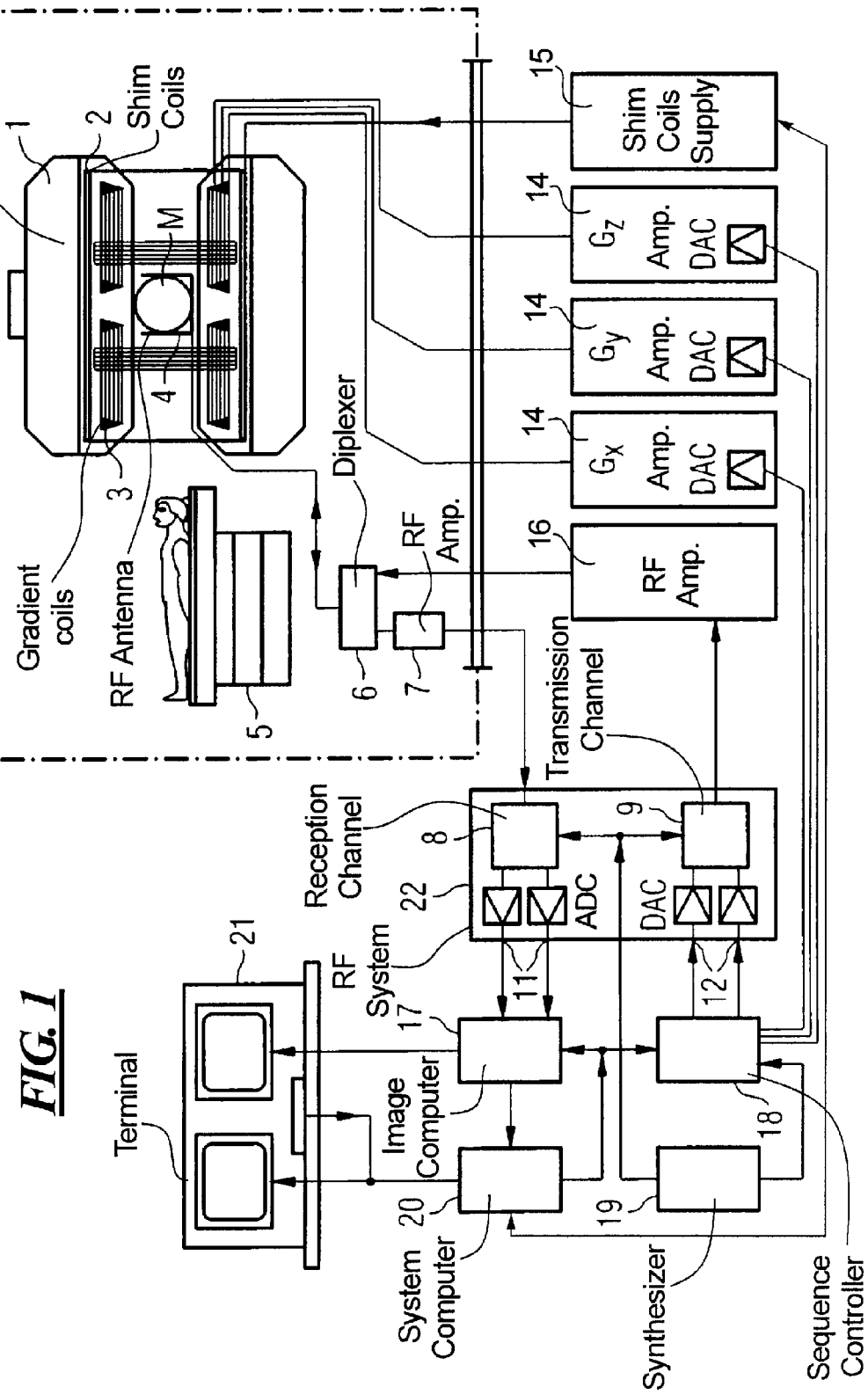
FIG. 1 is a schematic block diagram of a magnetic resonance imaging system constructed and operating in accordance with the present invention.

FIG. 1 is a schematic block diagram of a magnetic resonance tomography device with which optimized flow measurements according to the present invention are possible. The components of the magnetic resonance tomography device correspond to those of a conventional tomography device, with operational differences as described below. A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is defined in a spherical measurement volume M, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings. Each winding is supplied with current by an amplifier 14 in order to generate a linear gradient field in the respective directions of the Cartesian coordinate system. The first winding of the gradient field system 3 generates in a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence control 18 for the generation of gradient pulses at proper times.

Within the gradient field system 3, a radio-frequency antenna 4 is located which converts the radio-frequency pulses emitted by a radio-frequency power amplifier 30 into a magnetic alternating field in order to excite the nuclei and align the nuclear spins of the object to be examined or the region of the object to be examined. From the radio-frequency antenna 4, the alternating field emerging from the preceding nuclear spins, i.e. usually the nuclear spin echo signals brought about by a pulse sequence from one or more high-frequency pulses and one or more gradient pulses, is converted into a voltage that is supplied via an amplifier 7 to a radio-frequency receiver channel 8 of a radio-frequency system 22. The radio-frequency system 22 contains, furthermore, a transmission channel 9, in which the radio-frequency pulses are generated for the excitation of the nuclear magnetic resonance. In the process, the respective radio-frequency pulses based on a pulse sequence specified by the system computer 20 in the sequence control 18 are represented digitally as complex numbers. This numerical sequence is supplied as real and imaginary parts via responsive inputs 12 to a digital-analog converter in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume.

The conversion from transmitting to receiving operation is done via a diplexer 6. The radio-frequency antenna 4 emits the radio-frequency pulse to excite the nuclear spin into the measurement volume M and scans the resultant echo signals. The correspondingly obtained magnetic resonance signals are demodulated in the receiving channel 8 of the radio-frequency system 22 in a phase-sensitive manner, and are converted via respective analog-digital converter into a real part and an imaginary part of the measurement signal. Using an imaging computer 17, an image is reconstructed from the measurement data obtained in this way. The administration of the measurement data, the image data and the control programs is done via the system computer 20. Based on a specification with control programs, the sequence control 18 controls the generation of the desired pulse sequences and the corresponding scanning of k-space. In particular, the sequence control 18 controls the switching of the gradients at appropriate times, the transmission of the radio-frequency pulses with a defined phase and amplitude, and the reception of the magnetic resonance signals. The time basis for the radio-frequency system 22 and the sequence control 18 is furnished by a synthesizer 19. The selection of appropriate control programs for generating an MR image and the display of the generated nuclear spin image is done via a terminal (console) 21, which contains a keyboard and one or more screens.

FIG. 2 schematically illustrates an embodiment for the division of the k-space into two regions, namely a central region A and a peripheral region B. Sampling points in k-space in the regions A and B are schematically illustrated as solid dots, and sampling points in k-space outside of the peripheral region B are schematically illustrated as open dots. As is conventional, the sampling points are organized in a grid-like manner along perpendicular axis $k_y$ and $k_z$. $N_A$ designates the number of sampling points in the central region A, and $N_B$ designates the number of sampling points in the peripheral region B. These respective numbers of sampling points satisfy the relation $N_A = f \times (N_A + N_B)$, where f is a fraction or percentage that is less than 100%.

FIG. 3 schematically illustrates the result if the central region A and the peripheral region B shown in FIG. 2 are sampled at the same rate. The temporal resolution is designated in FIG. 3 as the chronological separation along the horizontal time axis between successive samplings of the central region A. The total time for sampling the central region A is designated $T_A$, and equals $N_A$ multiplied by the temporal resolution TR. Similarly, the time for sampling the peripheral region B equals $N_B$ multiplied by TR. In view of the relationship between $N_A$ and $N_B$ illustrated in FIG. 2, it can be seen in FIG. 3 that $T_A$ is shorter than $T_B$.

Figure 4:
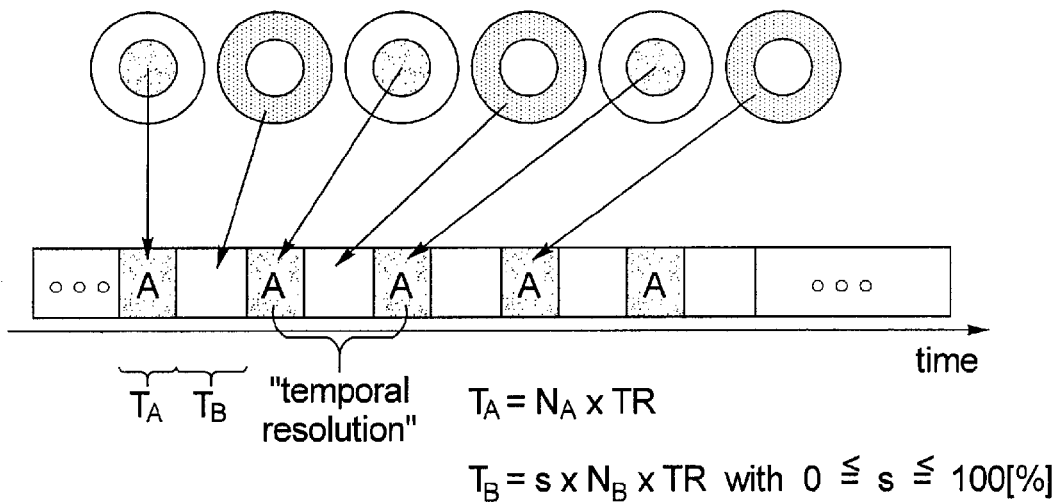

FIG. 4 illustrates the situation wherein the peripheral region B is sampled at a lower rate. This means that not every data point (data entry) in the peripheral region B is scanned (sampled) in each iteration. In the situation shown in FIG. 4, assuming $T_A$ is the same as in FIG. 3, than $T_B$ is shortened by a factor s, where $0 \leq s \leq 100\%$.

Figure 5:
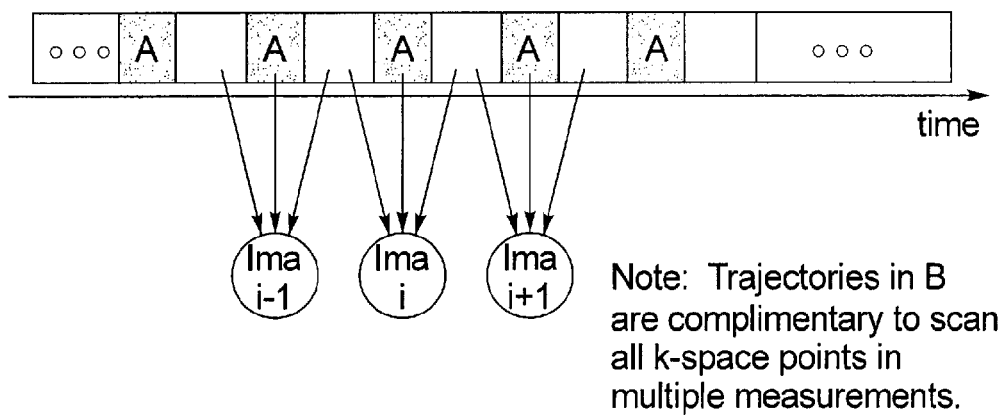
FIG. 5 illustrates updating of images in the context of k-space sampling in accordance with the present invention.

The result of this sampling of k-space in accordance with the present invention is that the low k-space lines are acquired more frequently, so that images can be updated more rapidly, because the images are determined largely by the low k-space lines. During image reconstruction, k-space points from the peripheral B that are closest to the central region A segment are used to complete the k-space data for one image, as is schematically illustrated in FIG. 5 for the three successive images designated Ima (i−1), Ima (i) and Ima (i+1).

The scanning trajectory in accordance with the present invention is defined according to the characteristics shown in FIG. 6. For each point in k-space, a radial distance from k=(0, 0) is calculated, and the azimuthal angle $\phi$ is determined as well. All k-space points are then sorted in a linearly increasing fashion. K-space is then divided into the aforementioned regions A and B such that A has f% of all k-space points. This then defines the radius $k_c$, that serves as the boundary between the central region and the remainder of k-space.

Such sorting is schematically illustrated in FIG. 7, wherein the number of total phase encode steps to be measured $N_t$, is plotted against the radius in k-space $k_r$. For points having the same distance from the k-space origin, sorting takes place according to increasing angle $\phi$. The maximum extent of the sorting designates a maximum k-space radius $k_{max}$.

Figure 8:
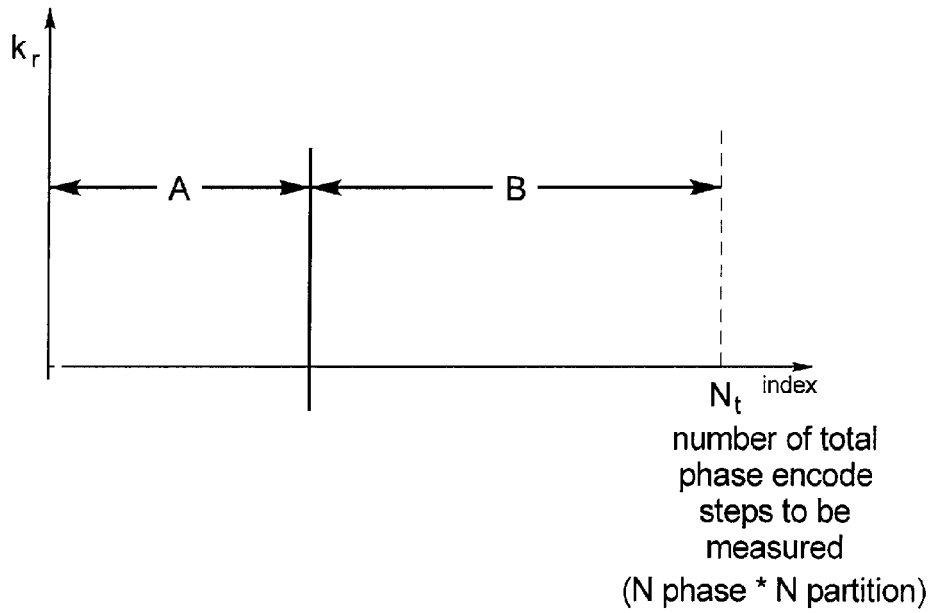
Figure 9:
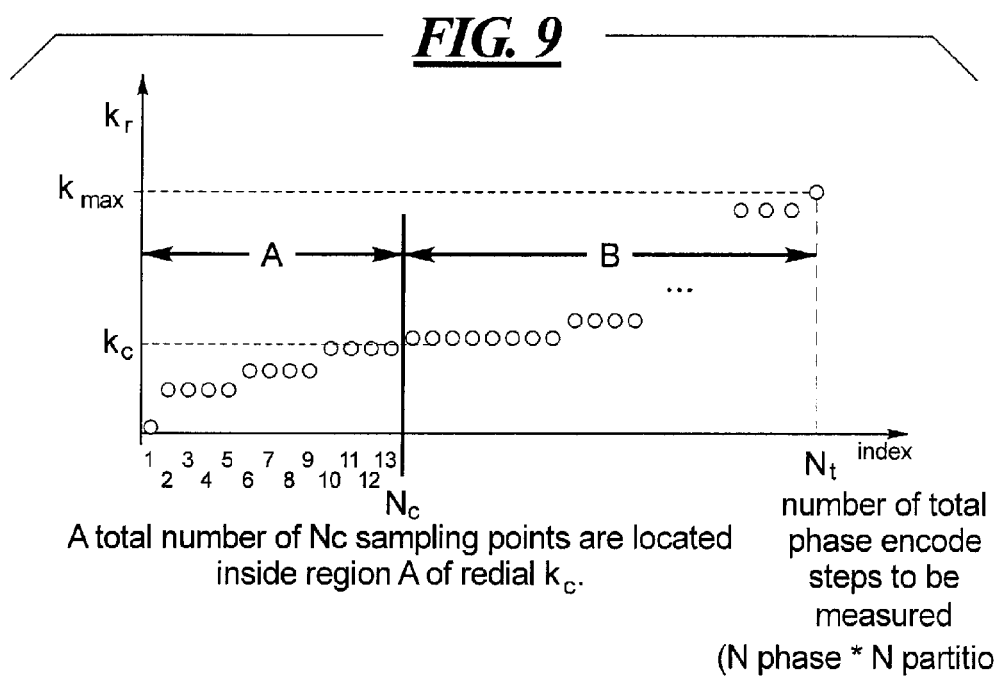

As illustrated in FIGS. 8 and 9, this results in a total number of sampling points being located inside the region A of radial size $k_c$, this total number being designated $N_c$. FIG. 8 shows the situation wherein the radius $k_c$ is chosen so as to divide k-space into a central region A and a peripheral region B. FIG. 9 illustrates the situation wherein the region A is sampled at a predetermined (standard) density, and the region B is sampled at a reduced density.

FIG. 10 schematically illustrates the sampling of region A at the full or standard density. The sampling takes place along one trajectory, spiraling in and spiraling out.

FIG. 11 illustrates the sampling of the region B at a reduced density compared to the standard or full density. This takes place along multiple trajectories, each starting at $k_c$, then spiraling out, then ending back at $k_c$. In FIG. 11, the sampling step size is four, and is constant, resulting in the two trajectories respectively designated with the solid line and the dashed line. In general, however, the step size may have different values, and can change during the projectory in the region B, so as to accommodate arbitrary acceleration factors.

The result of combining the individual trajectories is schematically illustrated in FIG. 12, wherein the fact that the successively sampled regions A were sampled at a higher density being schematically indicated by the stippling in the regions A. FIG. 13 illustrates a series of "snapshots" of k-space filling at respective times 1 through 9, with the degree of k-space filling being indicated by the stippling.

Although it may appear that the k-space filling is random, each step is well-defined, as can be seen by the aforementioned definition of the k-space trajectories, therefore, these trajectories can be called "stochastic trajectories." Therefore, a suitable acronym for the imaging sequence in accordance with the present invention is TWIST (Time-resolved angiography With Interleaved Stochastic Trajectories).

The time savings that is achieved in accordance with TWIST by defining a reference acquisition time $T_{acq}$ as equal to the product of $N_t$ and TR. The acquisition time for the region A in TWIST is $T_{TWIST}=[N_c+(N_t-N_c)/R_s] \cdot TR$. Therefore, the TWIST acceleration $A_{TWIST}$ is $A_{TWIST}=T_{acq}/T_{TWIST}=N_t/(N_c+(N_t-N_c)/R_s)$.

TWIST is compatible with known partial parallel acquisition techniques, such as GRAPPA and mSENSE. TWIST is also compatible with ECG triggering. A typical speedup factor associated with TWIST is between 2 and 3, and a typically speedup factor with GRAPPA is between 2 and 4, therefore by combining TWIST and GRAPPA it is possible to achieve a speedup factor as high as 12.

TWIST has applications for studies involving intracranial vasculature, carotid procedures, pulmonary procedures, renal studies, and peripheral vasculature studies.

In general, TWIST allows better detection of vascular diseases by including dynamic information in the images, and also allows better assessment of the progress of vascular diseases, also including the dynamic information. Due to the improved time resolution, TWIST can be used with smaller amounts of contrast agent, for example, as little as 4 to 5 cc, and thus is beneficial for patients with renal failure.

TWIST also assists in overcoming the timing problems associated with MRA, thereby allowing assessment of the arterial phase without venous contamination.

Although modifications and changes may be suggested by those of ordinary skill in the art, it is the intention of the inventors to embody within the patent warranted hereon all changes and modifications as reasonably and properly come within the scope of their contribution to the art.

We claim as our invention:

1. A method for generating a magnetic resonance (MR) data file, comprising the steps of:
    acquiring MR raw data from an examination subject using an MR imaging sequence;
    establishing k-space in a computer storage medium and dividing k-space into a contiguous central region and a contiguous peripheral region surrounding said central region;
    in a computerized procedure, entering said raw data into k-space at a constant sampling rate for both of said central and peripheral regions, by scanning said central region and said peripheral region alternatively a plurality of times and, during each scan of said peripheral region, scanning different sampling points in k-space with respect to the preceding scan of said peripheral region or with respect to the following scan of said peripheral region, while sampling said central region with a first sampling density of sampling points in k-space and sampling said peripheral region at a second sampling density of sampling points in k-space that is less than first sampling density, thereby producing sampled k-space; and
    making sampled k-space available in a data tile, in a form suitable for conversion into an image file, as an output from said computerized procedure.

2. A method as claimed in claim 1 comprising defining said central region and said peripheral region of k-space by establishing a radius that represents a boundary between said central region and said peripheral region.

3. A method as claimed in claim 2 comprising scanning said central region along a single spiral scanning trajectory, and scanning said peripheral region along multiple spiral scanning trajectories.

4. A method for generating a magnetic resonance (MR) image comprising the steps of:
  acquiring MR raw data from an examination subject using an MR imaging sequence;
  establishing k-space in a computer storage medium and dividing k-space into a contiguous central region and a contiguous peripheral region surrounding said central region;
  in a computerized procedure, entering said raw data into k-space at a constant sampling rate for both of said central and peripheral regions, by scanning said central region and said peripheral region alternatively a plurality of times and, during each scan of said peripheral region, scanning different sampling points in k-space with respect to the preceding scan of said peripheral region or with respect to the following scan of said peripheral region, while sampling said central region with a first sampling density of sampling points in k-space and sampling said peripheral region at a second sampling density of sampling points in k-space that is less than first sampling density, thereby producing sampled k-space; and
  reconstructing an image from sampled k-space and making the reconstructed image available as an image file as an output from said computerized procedure.

5. A method as claimed in claim 4 comprising reconstructing said reconstructed image by Fourier transforming sampled k-space.

6. A method as claimed in claim 4 comprising displaying said reconstructed image.

7. A method as claimed in claim 4 comprising defining said central region and said peripheral region of k-space by establishing a radius that represents a boundary between said central region and said peripheral region.

8. A method as claimed in claim 7 comprising scanning said central region along a single spiral scanning trajectory, and scanning said peripheral region along multiple spiral scanning trajectories.

9. A method as claimed in claim 4 comprising reconstructing said image from sampled k-space using k-space data from at least one scan of said central region and from at least two scans of said peripheral region that are closest to said one scan of said central region.

10. A magnetic resonance (MR) imaging system comprising:
  a MR data acquisition unit configured to interact with an examination subject;
  a controller that operates said (MR) data acquisition unit, by implementing a magnetic resonance imaging sequence, to acquire MR raw data from the examination subject;
  an image computer having access to a computer storage medium wherein said image computer establishes k-space and divides k-space into a contiguous central region and a contiguous peripheral region surrounding said central region, said image computer entering said raw data into k-space at a constant sampling rate for both of said central and peripheral regions, by scanning said central reion and said peripheral region alternatively a plurality of times and, during each scan of said peripheral region, scanning different sampling points in k-space with respect to the preceding scan of said peripheral region or with respect to the following scan of said peripheral region, while sampling said central region with a first sampling density of sampling points in k-space and sampling said peripheral region at a second sampling density of sampling points in k-space that is less than said first sampling density, thereby producing sampled k-space, and said image computer reconstructing an image of the examination subject from sampled k-space; and
  a display in communication with said image computer at which said image computer causes the reconstructed image to be visually displayed.

11. A system as claimed in claim 10 wherein said image computer reconstructs said image by Fourier transforming sampled k-space.

12. A system as claimed in claim 10 wherein said image computer establishes a radius in k-space that defines said central region and said peripheral region and serves as a boundary between said central region and said peripheral region.

13. A system as claimed in claim 12 wherein said image computer scans said central region using a single spiral scanning trajectory, and scan said peripheral region using multiple spiral scanning trajectories.

14. A system as claimed in claim 10 wherein said controller operates said MR data acquisition unit to acquire said MR data using GRAPPA as said MR imaging sequence.

15. A system as claimed in claim 10 comprising a contrast agent injector configured to interact with the examination subject to inject contrast agent into the vascular system of the examination subject contemporaneously with the acquisition of said MR raw data.

16. A system as claimed in claim 10 wherein said image computer reconstructs said image as an angiographic image, enhanced by said contrast agent, of said examination subject.

17. A system as claimed in claim 10 wherein said image computer reconstructs said image from sampled k-space using k-space data from at least one scan of said central region and from at least two scans of said peripheral region that are closest to said one scan of said central region.

* * * * *